United States Patent [19]

McFee et al.

[11] 4,159,919
[45] Jul. 3, 1979

[54] MOLECULAR BEAM EPITAXY USING PREMIXING

[75] Inventors: James H. McFee, Colts Neck; Barry I. Miller, Middletown, both of N.J.

[73] Assignee: Bell Telephone Laboratories, Incorporated, Murray Hill, N.J.

[21] Appl. No.: 869,779

[22] Filed: Jan. 16, 1978

[51] Int. Cl.$^2$ .......................................... H01L 21/203
[52] U.S. Cl. ..................................... 148/175; 148/1.5; 156/610; 156/DIG. 70
[58] Field of Search ................. 148/175, 1.5; 156/610, 156/DIG. 70; 427/248, 294

[56] References Cited

U.S. PATENT DOCUMENTS

| | | | |
|---|---|---|---|
| 3,672,992 | 6/1972 | Schaefer | 148/175 X |
| 3,716,424 | 2/1973 | Schoolar | 148/175 |
| 3,793,070 | 2/1974 | Schoolar | 148/175 X |
| 3,915,765 | 10/1975 | Cho et al. | 148/175 |
| 4,069,356 | 1/1978 | Fischer | 427/248 |

OTHER PUBLICATIONS

Chang et al., "Fabrication for Multilayer Semiconductor Devices", I.B.M. Tech. Discl. Bull., vol. 15, No. 2, Jul. 1972, pp. 365-366.
Chang et al., "Source Shaping . . . by Molecular Beam Epitaxy".
Ibid., vol. 15, No. 1, Jun. 1972, pp. 180-181.
Cho et al., "Molecular Beam Epitaxy of GaAs, AlGaAs and GaP", 1970 Symposium on GaAs, Paper No. 2, pp. 18-29.
Bis et al., "Thin Epitaxial Films of $Pb_{1-x}Sn_xTe$", J. Vac. Science & Technology, vol. 9, No. 1, pp. 226-230.

Primary Examiner—L. Dewayne Rutledge
Assistant Examiner—W. G. Saba
Attorney, Agent, or Firm—Daniel D. Dubosky

[57] ABSTRACT

An improved method of forming ternary and quaternary epitaxial films by molecular beam epitaxy involves controlling precisely the ratio of concentrations of two alloying elements in the final compound by heating predetermined independently adjustable quantities of two or more alloying elements in the same oven.

7 Claims, 1 Drawing Figure

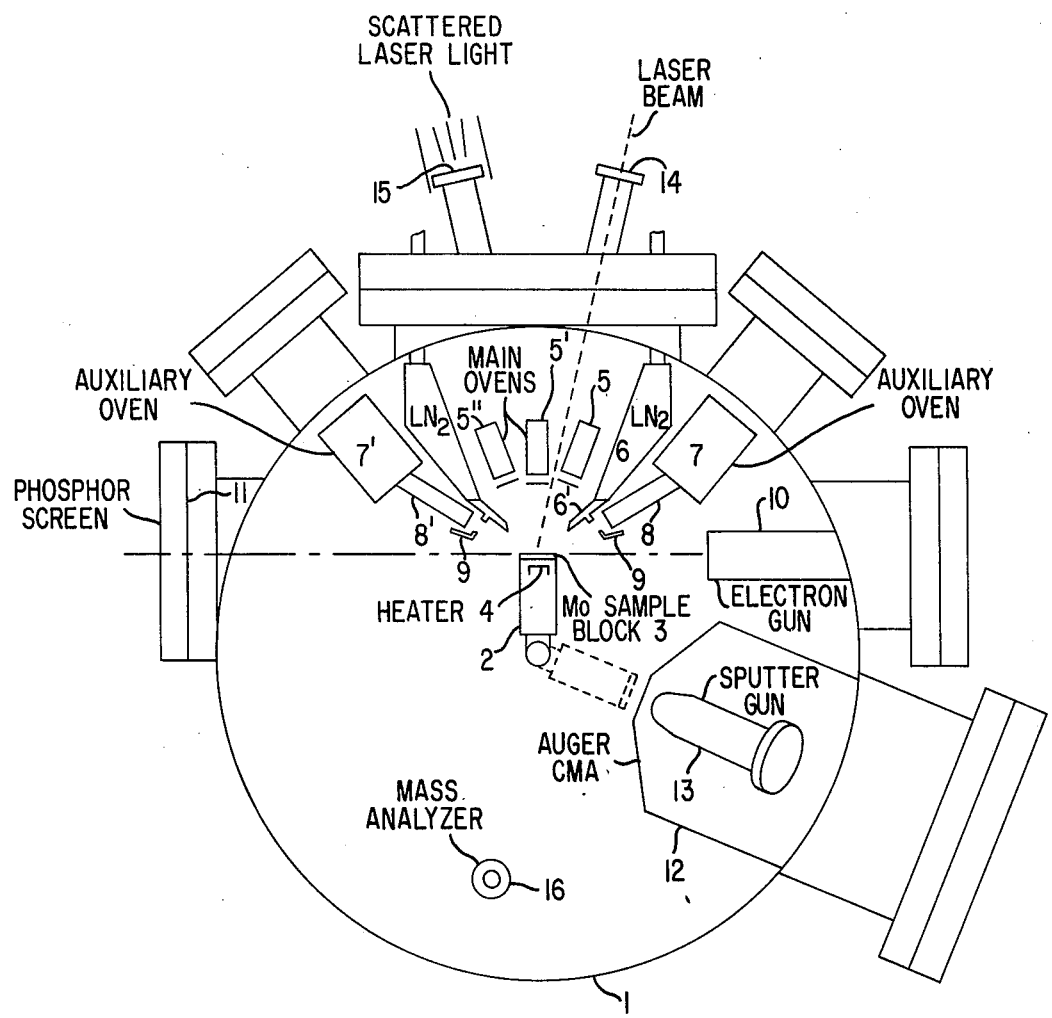

MOLECULAR BEAM EPITAXY USING PREMIXING

BACKGROUND OF THE INVENTION

In the prior art of molecular beam epitaxy (hereafter abbreviated as MBE), binary and ternary compounds have been grown. Two prior art U.S. Pat. No. 3,615,931, issued to John R. Arthur, Jr. on Oct. 26, 1971 and assigned to the assignee of this application and U.S. Pat. No. 3,751,310, issued to Alfred Yi Cho on Aug. 7, 1973 and assigned to the assignee of this application, are incorporated in this application by reference.

A binary compound, GaAs, has been formed in as apparatus that used GaAs feedstock in an oven. In that case, the ratio of Ga to As in the atomic beams was not critical because the formation of GaAs is self-regulating; the only requirement is that there be an excess of As. This property of self-regulation does not apply to many compounds, however, and in particular does not apply to pairs of elements from the same column of the Periodic Table.

When ternary compounds, such as $Al_xGa_{1-x}As$ or $Ga_xAs_{1-x}P$, were formed, more than one oven was used and the value of x was determined by the relative temperatures of the ovens.

The prior art has used dopants, such as Ge in molecular beam epitaxy. A dopant is distinguished from an alloying element in that it is used to make a semiconductor compound n or p-type, is present in concentrations typically less than $10^{-4}$, and may vary in concentration by four orders of magnitude. In contrast, alloying elements are present in comparable amounts and must be controlled in concentration ratio to less than 1 percent in order to form a lattice-matched epitaxial layer onto a suitable substrate. The use of separate ovens for two or more elements that were required to be in a certain concentration ratio resulted in considerable variation of their ratio over the surface and throughout the thickness of the layer being formed, as a result of the different spatial distribution of the beams from the ovens and of fluctuations in the desired temperatures of the ovens.

SUMMARY OF THE INVENTION

The invention is a method of molecular beam epitaxy that solves the problems of the prior art referred to above by heating independently adjustable predetermined quantities of alloying elements in the same oven. The quantities are determined empirically by measuring the vapor pressures of the elements at the operating temperature of the oven and then calculating the ratio of feedstock quantities that will give the desired flux ratio at the operating temperature.

BRIEF DESCRIPTION OF THE DRAWINGS

FIG. 1 shows a horizontal cross section of an apparatus used for practicing the invention.

DETAILED DESCRIPTION

In FIG. 1, vacuum vessel 1, an 18 inch diameter stainless steel bell jar encloses an illustrative molecular beam apparatus used to practice the invention. The apparatus is similar to that used in the prior art patents referred to above and is well known to those skilled in the art. A Varian sample holder 2 capable of rotation about a vertical axis is located at the center of the vacuum vessel. All parts of the sample holder subject to heating were replaced by Mo or Ta, in order to permit heating of the sample by heater 4 to the required operating temperature of approximately 500° C. During operation, the substrates were mounted on Mo sample block 3, 2.5 cm×2.5 cm×3 mm thick, and heated by heater 4. The atomic beams that form the epitaxial film emerge from ovens 5, 5', and 5", which are cylindrical in shape, 5 cm long×1 cm diameter, consisting essentially of a helically-wound Ta heating element that encloses a pyrolytic Boron Nitride (99.999 percent pure) crucible. Several layers of 0.0005 inch Ta foil are wound on the outside of each oven as a heat shield. Heater and support construction is entirely of Ta or Mo. Each oven has a shutter that is used to block the emerging beam when desired. These ovens are enclosed in shroud 6, that has a generally cylindrical shape and is cooled by liquid nitrogen. A gold-plated copper nose cone 6' is attached to shroud 6 to limit the beam spread from the main ovens. These ovens are run at relatively high temperatures, 800°–900° C. in the case of metals or common dopant elements. For lower temperature elements, such as P, auxilary ovens 7 and 7' are used. These large capacity ovens (20 cm³) have Al bodies with embedded heaters and a separately heated ceramic snout 8, 8' aimed at the substrate. These ovens also have gold-plated copper shields 9, 9' that are attached to nose cone 6' of nitrogen-cooled shroud 6 and are used to limit spread of their beams.

A variety of diagnostic tools are included in order to monitor the composition and rate of the beams. Electron gun 10 emits a 1 mm diameter, 3 kev electron beam that strikes the film being grown at a glancing angle. The reflection electron diffraction pattern (RED) that results is monitored on a four-inch diameter phosphor screen, 11. The pattern on the screen is used to monitor the surface crystal structure before and during growth. A 10 kev sample holder 2 may be related to the position indicated by the broken lines where an Auger cylindrical mirror analyzer (CMA) is used in order to determine the surface stoichiometry and to detect impurities as small as 0.1 percent on the surface. A 3 kev sputter gun 13 is mounted above the CMA at an angle of 15° from the vertical so that the sample can be sputtered while an Auger spectrum is being taken. Typically, sputtering is done at 3 kev with 2 $\mu A/cm^2 Ar^+$ current density.

In order to observe the smoothness of the epitaxial layer during growth, a laser beam is incident on the layer, coming through port 14. The scattered (non-specular) light is monitored through port 15. The incident beam was provided by a 6328Å He-Ne laser and was chopped at 90 Hz. The scattered light was detected by a photomultiplier and a lock-in amplifier. This technique was extremely sensitive to any change in surface smoothness and provided the best real-time monitor of layer quality.

A precision quadrupole mass analyzer 16 (UTI Model 100C, available from Uthe Technology International, Sunnyvale, California 94806) was used to monitor the partial pressures in the system and the beam fluxes before and during a growth run. The axis of the analyzer is approximately perpendicular to the incoming beams so that the calibration will not change as a result of coating of the elements. A beam chopper is placed in the system ahead of the analyzer so that phase-sensitive techniques can be used. Typically, dopant fluxes as low as a few parts per million may be detected.

With the apparatus described above, the invention has been reduced to practice, producing $Ga_yIn_{1-y}As$, with y=0.47, which precisely lattice matches the InP substrate on which it is grown. The Ga and In were placed in the same oven, so that the value of y could be precisely controlled.

The substrates for the epitaxial film of GaInAs were the (100) and ($\bar{1}\bar{1}\bar{1}$) faces of In P. The substrates were indium-soldered to a molybdenum sample block and chemically polished to a mirror finish on a dextilose paper lap saturated with weak bromine-methanol solution. The sample block is then promptly loaded into the MBE system which is pumped and mildly baked (150° C.) overnight to a typical base pressure of $1 \times 10^{-9}$ torr or less. In the morning the sample block (which had remained at ambient overnight) is heated to 365° C. and the substrates are sputter-etched for about 5 minutes in $5 \times 10^{-5}$ torr of argon at 3 kev and about 5 $\mu a/cm^2$ current density. Following this sputter cleaning the samples are annealed at 365° C. for at least 1 hour behind a shutter which shields the substrates from the direct source fluxes. During the annealing period the source ovens are brought to operating temperature and fluxes adjusted to the desired values. The source fluxes are monitored by a UTI Model 100C quadrupole mass analyzer which is situated so that it has direct line-of-sight to the source ovens at all times. A chopper wheel is placed between the source ovens and mass-analyzer ionizer cage and synchronous detection is used to enhance the signal-to-noise ratio of the mass analyzer. Epitaxial layer growth is initiated by raising the sample temperature of 510° C. (typical for GaInAs) and then opening the sample shutter.

It has been found empirically that a Gallium:Indium mass ratio of 10:1 in the oven yields the approximately equal fluxes required for a lattice-matched composition in the growing layer. The vapor pressure of Ga varies slightly more rapidly with temperature than does In, so that changing the source temperature is a way of fine-tuning the flux ratio (the parameter y). This feature of the common Ga-In source is utilized in practice to adjust the ratio Ga/In for precise lattice match. The range of adjustment is limited by the changes in the growth rate. For example, at a source temperature of 800° C. the Ga/In flux ratio increases by $\approx 0.5$ percent/°C. while the individual Ga and In fluxes increase at a rate of $\approx 3$ percent/°C.

The required 10 to 1 Ga to In mixture means that only a relatively small amount of In will be present in the single source. Thus, if the source volume is small, In depletion in the source during film growth will lead to a nonuniformity in the film composition. Our standard oven crucibles hold about 1.5 cm$^3$ of charge. In this case, for a growth rate of 0.8 $\mu$m/hour the Ga/In flux ratio is observed to increase 2.5 percent/hour due to In depletion. For an initially lattice-matched Ga$_y$In$_{1-y}$As film this increase means that y would vary from 0.470 to 0.476 from bottom to top of a 2 $\mu$m thick film. However, even this small amount of change in the Ga/In ratio can be compensated by reducing the source temperature gradually, as explained above. Also, of course, the effects of In depletion could be made negligible by substantially increasing the source volume.

In order to grow ternary layers of precise composition, a reliable means of measuring the Ga/In flux ratio before and during growth is almost a necessity. The UTI mass analyzer can serve this purpose provided it is properly used. During growth of a GaInAs layer a background pressure of order 10$^{-6}$ torr of As is present in our MBE system. The presence of this much As has several effects on the performance of the mass analyzer. Firstly, the basic sensitivity of the analyzer for any given mass number is increased, but the magnitude of the increase is a function of mass number. Thus if the Ga (M=69) and In (M=115) fluxes are measured with the analyzer, the current ratio $i_{69}/i_{115}$ obtained will be a function of the As background pressure. Secondly, we have observed occasional abrupt changes in the basic sensitivity of the analyzer which take place without apparent cause. Fortunately, these abrupt sensitivity changes appear to be independent of mass number and do not alter the current ratio $i_{69}/i_{115}$. Finally, we find that setting the mass analyzer to read the As (M=150 or M=75) flux will cause the basic sensitivity to change drastically. Following a reading of the As flux the basic sensitivity gradually relaxes toward its original value over a period of about one hour. Thus, when precise Ga/In flux measurements are desired, As flux readings must be avoided.

In practice the mass analyzer was calibrated in terms of the composition, y, of the Ga$_y$I$_{1-y}$As layer. This was done by growing a series of five epitaxial layers, each layer being grown on a separate day's run. Each layer corresponded to a different value of y, the composition ranging from decidedly In-rich, through lattice-match, to decidedly Ga-rich. The y value of each layer was determined following removal from the MBE system by use of a scanning electron microscope equipped to do precise compositional analysis of thin films. The result of this procedure was an empirical plot which relates y in the epitaxial layer to the mass-analyzer current ratio, $i_{69}/i_{115}$. Use of the single source containing the Ga-In mixture insures that such a calibration can be used to grow a layer of any desired composition (e.g. lattice-matched composition). Not only does use of the single source insure that the epitaxial layer will have a uniform, well-defined composition, but it also insures that the mass analyzer (located at a position different from that of the epitaxial layer) will see exactly the same Ga/In flux ratio as that falling on the epitaxial layer. This is not so in the case of separate Ga and In sources. In this case, changes in the positions of the sources or changes in the melt configurations (for example, due to depletion of the melts or due to recharging the ovens) can alter the Ga/In ratio seen by the mass analyzer with respect to that seen by the epitaxial layer and therefore make it impossible to calibrate the mass analyzer reliably.

A lattice-matched InP/Ga$_y$In$_{1-y}$As/InP double-heterostructure sample was grown, using an InP substrate and MBE film for the other two layers. When pumped by a Nd:YAG laser, the double-heterostructure crystal lased at about 1.4 $\mu$m with a pump threshold comparable to that of a GaAs/AlGaAs laser. In addition, suitable electrical contacts were put onto such a double-heterostructure and lasing occurred at a threshold as low as 3.2 Ka/cm$^2$ for a 0.6 $\mu$m Ga$_y$In$_{1-y}$As active layer. This threshold is also comparable to the GaAs/AlGaAs laser.

An extension of this method is the use of two ovens each containing two elements. For example, a quarternary comprising two elements from column III and two from column V would be well suited to this technique, the elements from one column being contained in the same oven.

What is claimed is:

1. A molecular beam epitaxy method of growing an epitaxial film of predetermined chemical composition comprising the steps of:

loading a plurality of ovens with predetermined quantities of chemical feedstocks, preparing a substrate on a sample holder, evacuating said apparatus, heating said sample and said plurality of ovens to predetermined temperatures, and directing an atomic beam from each of said ovens at said substrate, whereby an epitaxial film is formed on said substrate from said atomic beams:

characterized in that at least one of said plurality of ovens contains a mixture of independently adjustable quantities of two alloying elements in a first predetermined feedstock ratio and in that said first predetermined feedstock ratio is such that said atomic beam from said at least one oven contains said two alloying elements in a first predetermined flux ratio different from said first predetermined feedstock ratio.

2. A method of growing an epitaxial film according to claim 1, further characterized in that said first predetermined flux ratio is adjusted by varying said predetermined temperature of said at least one oven.

3. A method according to claim 2, further characterized in that said first predetermined flux ratio is monitored during the growth of said film.

4. A method of growing an epitaxial film according to claim 3, further characterized in that said two alloying elements are in the same column of the Periodic Table of the elements.

5. A method according to claim 1, further characterized in that a second one of said plurality of ovens contains a mixture of independently adjustable quantities of two different alloying elements, said ovens producing a first atomic beam having a first predetermined flux ratio and a second atomic beam having a second predetermined flux ratio.

6. A method according to claim 5, further characterized in that said first and second predetermined flux ratios are independently adjusted by varying said predetermined temperatures of said one of said plurality of ovens and said second one of said plurality of ovens.

7. A method according to claim 6, further characterized in that said two alloying elements in said one of said ovens are from a first column of the Periodic Table of the elements and that said two alloying elements in said second one of said ovens are from a second column of the Periodic Table of the elements.

* * * * *